(12) United States Patent  
Jain

(10) Patent No.: US 8,951,868 B1
(45) Date of Patent: Feb. 10, 2015

(54) FORMATION OF FUNCTIONAL GATE STRUCTURES WITH DIFFERENT CRITICAL DIMENSIONS USING A REPLACEMENT GATE PROCESS

(71) Applicant: International Business Machines Corporation, Armonk, NY (US)

(72) Inventor: Sameer H. Jain, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/071,984

(22) Filed: Nov. 5, 2013

(51) Int. Cl.
H01L 21/8234 (2006.01)
H01L 29/66 (2006.01)
H01L 27/092 (2006.01)

(52) U.S. Cl.
CPC ........ *H01L 29/6681* (2013.01); *H01L 27/0924* (2013.01)
USPC ............................. 438/275; 438/230; 438/183

(58) Field of Classification Search
USPC .................. 438/199, 230, 275, 587, 595, 183
See application file for complete search history.

(56) References Cited

U.S. PATENT DOCUMENTS

| 7,023,055 | B2 | 4/2006 | Ieong et al. | |
|---|---|---|---|---|
| 7,329,923 | B2 | 2/2008 | Doris et al. | |
| 8,084,346 | B1 * | 12/2011 | Guo et al. | 438/595 |
| 8,304,306 | B2 | 11/2012 | Cai et al. | |
| 8,835,237 | B2 * | 9/2014 | Jagannathan et al. | 438/183 |
| 2005/0116290 | A1 | 6/2005 | de Souza et al. | |
| 2008/0315281 | A1 * | 12/2008 | Park | 257/315 |
| 2010/0314687 | A1 * | 12/2010 | Xu | 257/369 |
| 2011/0189847 | A1 * | 8/2011 | Tsai et al. | 438/595 |
| 2013/0309834 | A1 * | 11/2013 | Hsieh et al. | 438/382 |

* cited by examiner

*Primary Examiner* — Kevin M Picardat
(74) *Attorney, Agent, or Firm* — Scully, Scott, Murphy & Presser, P.C.; H. Daniel Schnurmann

(57) ABSTRACT

A plurality of sacrificial gate structures is formed on substrate. A first set of sacrificial gate structures of the plurality of sacrificial gate structures contains a sacrificial spacer on sidewall surfaces thereof, and a second set of sacrificial gate structures of the plurality of sacrificial gate structures has bare sidewall surfaces. A dielectric spacer is provided to the first and second sets of sacrificial gate structures. Each sacrificial gate structure of the first and second sets is removed together with the sacrificial spacers providing first gate cavities in the area previously occupied by a sacrificial gate structure of the first set of sacrificial gate structures and the sacrificial spacer and second gate cavities in the area previously occupied by a sacrificial gate structure of the second set of sacrificial gate structures. A functional gate is formed in each of the first and second gate cavities.

19 Claims, 8 Drawing Sheets

FORMATION OF FUNCTIONAL GATE STRUCTURES WITH DIFFERENT CRITICAL DIMENSIONS USING A REPLACEMENT GATE PROCESS

BACKGROUND

The present application relates to semiconductor device manufacturing, and more particularly to a method of forming semiconductor devices containing functional gate structures which have different critical dimensions, i.e., gate lengths.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

Formation of functional gate structures having different critical dimensions is challenging, particularly in the context of forming such functional gate structures within a non-planar semiconductor device such as, for example, a finFET device. This challenge is further exacerbated by the continued progress towards smaller gate pitches, which are well below the lithography limits, making it harder to even pattern features that were feasible at larger pitches. In particular, providing devices with controlled differences in their gate length—a much desired feature—becomes extremely challenging. Non lithography based solutions like gate formation through multiple sidewall image transfer (SIT) are being considered for future technology nodes. There is a clear need for a simplified solution to this problem.

SUMMARY

A plurality of sacrificial gate structures is formed on substrate. A first set of sacrificial gate structures of the plurality of sacrificial gate structures contains a sacrificial spacer on sidewall surfaces thereof, and a second set of sacrificial gate structures of the plurality of sacrificial gate structures has bare sidewall surfaces. A dielectric spacer is provided to the first and second sets of sacrificial gate structures. Each sacrificial gate structure of the first and second sets is removed together with the sacrificial spacers providing first gate cavities in the area previously occupied by a sacrificial gate structure of the first set of sacrificial gate structures and the sacrificial spacer and second gate cavities in the area previously occupied by a sacrificial gate structure of the second set of sacrificial gate structures. A functional gate is formed in each of the first and second gate cavities.

In one aspect of the present application, a method of forming a semiconductor device having functional gate structures with different critical dimensions is provided. The method of the present application includes forming a plurality of sacrificial gate structures on a surface of a substrate, wherein a first set of the plurality of sacrificial gate structures contains a sacrificial spacer located on a sidewall surfaces of each sacrificial gate structure, and a second set of the plurality of sacrificial gate structures contains sacrificial gate structures having bare sidewall surfaces. Next, a dielectric spacer is provided to the first and second sets of the plurality of sacrificial gate structures. In accordance with the present application, each dielectric spacer provided to the first set of the plurality of sacrificial gate structures contacts a sidewall surface of the sacrificial spacer and each dielectric spacer provided to the second set of the plurality of sacrificial gate structures contacts the bare sidewall surfaces of the sacrificial gate structures. Next, each sacrificial gate structure of the first set of the plurality of sacrificial gate structures and the sacrificial spacers are removed to provide first cavities having a first width, and each sacrificial gate structure of the second set of the plurality of sacrificial gate structures are removed to provide second cavities having a second width. In accordance with the present application, the second width is lesser than the first width. A functional gate structures is then provided in each of the first and second gate cavities.

In one embodiment, the method can be used in forming a non-planar semiconductor device. In such an embodiment, the method may include forming a plurality of semiconductor fins extending from a surface of a substrate. Next, a plurality of sacrificial gate structures are provided, wherein each sacrificial gate structure of the plurality of sacrificial gate structures is oriented perpendicular to and straddling at least one semiconductor fin of the plurality of the semiconductor fins, and wherein a first set of the plurality of sacrificial gate structures contains a sacrificial spacer located on a sidewall surfaces of each sacrificial gate structure, and a second set of the plurality of sacrificial gate structures contains sacrificial gate structures having bare sidewall surfaces. A dielectric spacer is then provided to the first and second sets of the plurality of sacrificial gate structures. In accordance with the present application, each dielectric spacer provided to the first set of the plurality of sacrificial gate structures contacts a sidewall surface of the sacrificial spacer and each dielectric spacer provided to the second set of the plurality of sacrificial gate structures contacts the bare sidewall surfaces of the sacrificial gate structures. Next, each sacrificial gate structure of the first set of the plurality of sacrificial gate structures and the sacrificial spacers are removed to provide first cavities having a first width, and each sacrificial gate structure of the second set of the plurality of sacrificial gate structures are removed to provide second cavities having a second width. In accordance with the present application, the second width is lesser than the first width. A functional gate structures is then provided in each of the first and second gate cavities.

DETAILED DESCRIPTION

Figure 1:
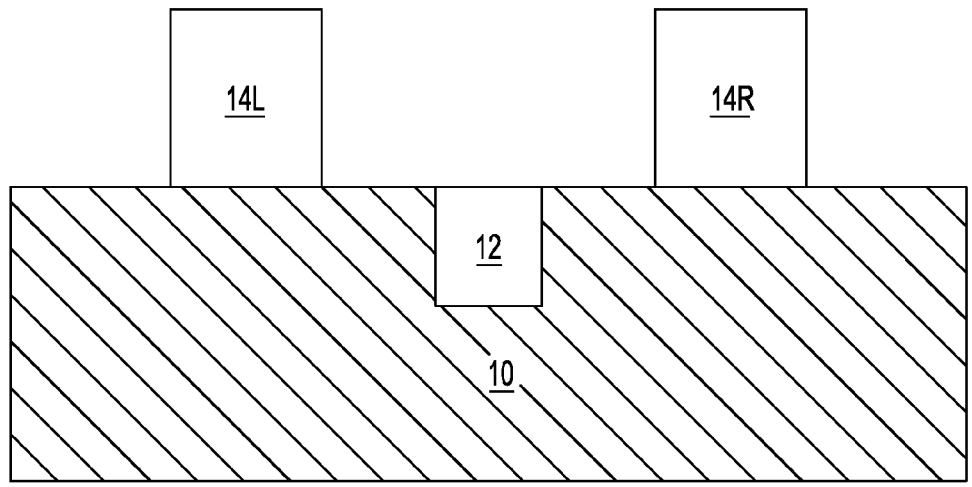
FIG. 1 is a cross sectional view of a first exemplary semiconductor structure of the present application including a semiconductor substrate having a plurality of sacrificial gate structures located on a surface of the semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like elements across different embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Reference is first made to FIGS. 1-8 which illustrate an embodiment of the present application in which a planar semiconductor device having functional gate structures of different critical dimensions, i.e., gate lengths, is formed utilizing a replacement gate process.

Referring first to FIG. 1, there is illustrated a semiconductor substrate 10 having a plurality of sacrificial gate structures located on a surface of the semiconductor substrate 10. In the drawings, two sacrificial gate structures (labeled as 14L, 14R) are shown by way of one example.

In some embodiments of the present application, the semiconductor substrate 10 can be a bulk semiconductor substrate. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon. In other embodiments, the semiconductor substrate 10 may comprise a polycrystalline or amorphous semiconductor material.

In another embodiment, a semiconductor-on-insulator (SOI) substrate (not specifically shown) can be employed as the semiconductor substrate 10. Although not specifically shown, one skilled in the art understands that an SOI substrate includes a handle substrate, a buried insulator layer located on an upper surface of the handle substrate, and a semiconductor layer located on an upper surface of the buried insulator layer. The handle substrate provides mechanical support for the buried insulator layer and the semiconductor layer.

The handle substrate and the semiconductor layer of the SOI substrate may comprise the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a semiconductor layer can be used as semiconductor substrate 10.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 100 Å to 1000 Å. In another example, the thickness of the semiconductor layer of the SOI substrate can be from 500 Å to 700 Å. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulator layer of the SOI substrate typically has a thickness from 10 Å to 2000 Å, with a thickness from 1000 Å to 1500 Å being more typical. The thickness of the handle substrate of the SOI substrate is inconsequential to the present application.

In some other embodiments, hybrid semiconductor substrates which have different surface regions of different crystallographic orientations can be employed as semiconductor substrate 10. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 10 may be doped, undoped or contain doped and undoped regions therein. For clarity, the doped regions are not specifically shown in the drawings of the present application. Each doped region within the semiconductor material of the semiconductor substrate 10 may have the same, or they may have different conductivities and/or doping concentrations. The doped regions that are present in the semiconductor material of semiconductor substrate 10 are typically referred to as well regions and they are formed utilizing a conventional ion implantation process or gas phase doping.

In some embodiments, the substrate can be processed to include at least one isolation structure 12 located therein. The at least one isolation structure 12 can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation structure 12 provides isolation between neighboring gate structure regions, typically required when the neighboring gates have opposite conductivities, i.e., nFETs and pFETs. As such, the at least one isolation structure 12 separates an nFET device region from a pFET device region.

The first exemplary structure shown in FIG. 1 also includes a plurality of sacrificial gate structures 14L, 14R. The term "sacrificial gate structure" is used throughout the present application to denote a material that serves as a placeholder structure for a functional gate structure to be subsequently formed. Throughout the present application, sacrificial gate structure 14L can be referred to as a sacrificial gate structure of a first set of sacrificial gate structures, while sacrificial gate structure 14R can be referred to as a sacrificial gate structure of a second set of sacrificial gate structures.

Each sacrificial gate structure 14L, 14R of the plurality of sacrificial gate structures can be formed by first providing a blanket layer of a sacrificial gate material on semiconductor substrate 10. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu.

After providing the blanket layer of sacrificial gate material, the blanket layer of sacrificial gate material can be patterned by lithography or a side wall image transfer process and etching so as to form sacrificial gate structures 14L, 14R on a surface of the semiconductor substrate 10.

Each sacrificial gate structure 14L, 14R that is formed may have a width, as measured from one sidewall surface to an opposing side surface, of from 10 nm to 30 nm. Other widths that are lesser than or greater than the aforementioned thickness range can also be used as the width of each sacrificial gate structure 14L, 14R in the present application.

Figure 2:
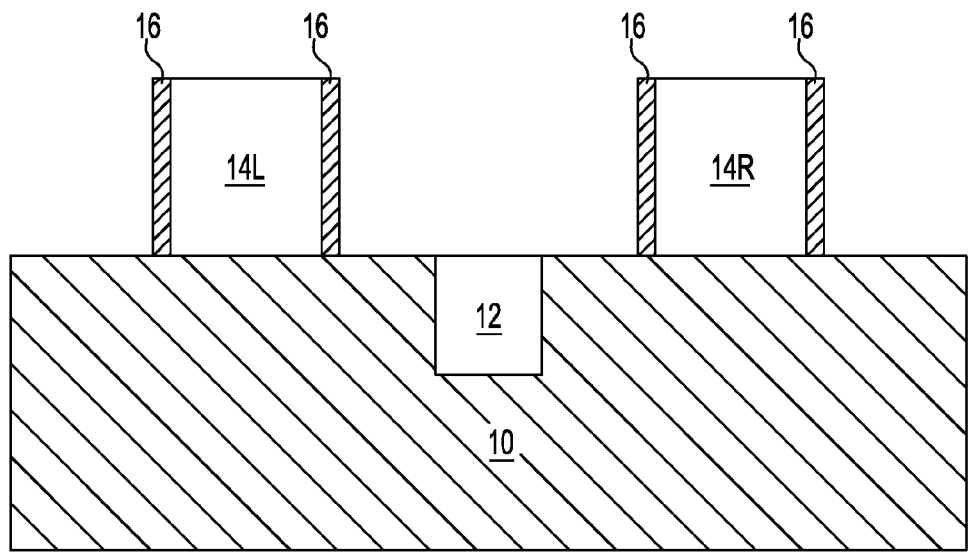
FIG. 2 is a cross sectional view of the first exemplary semiconductor structure shown in FIG. 1 after forming a sacrificial spacer on sidewall surfaces of each sacrificial gate structure.

Referring now to FIG. 2, there is illustrated the first exemplary semiconductor structure shown in FIG. 1 after forming a sacrificial spacer 16 on sidewall surfaces of each sacrificial gate structure 14L, 14R. Each sacrificial spacer 16 that is formed comprises a dielectric oxide, dielectric nitride and/or dielectric oxynitride. In one example, each sacrificial spacer 16 that is formed is comprised of silicon dioxide. In another example, each sacrificial spacer 16 that is formed is comprised of silicon nitride. In yet another example, each sacrificial spacer 16 that is formed may comprise silicon oxynitride. Although the sacrificial spacer 16 is shown and described as containing a single spacer material, each sacrificial spacer 16 may include a plurality of (i.e., more than one)

spacer materials, i.e., a combination of silicon nitride and silicon oxide. In yet another embodiment of the present application, some of the sacrificial spacers 16 may include a single spacer material, while other sacrificial spacers 16 may include multiple spacer materials.

Figure 5:
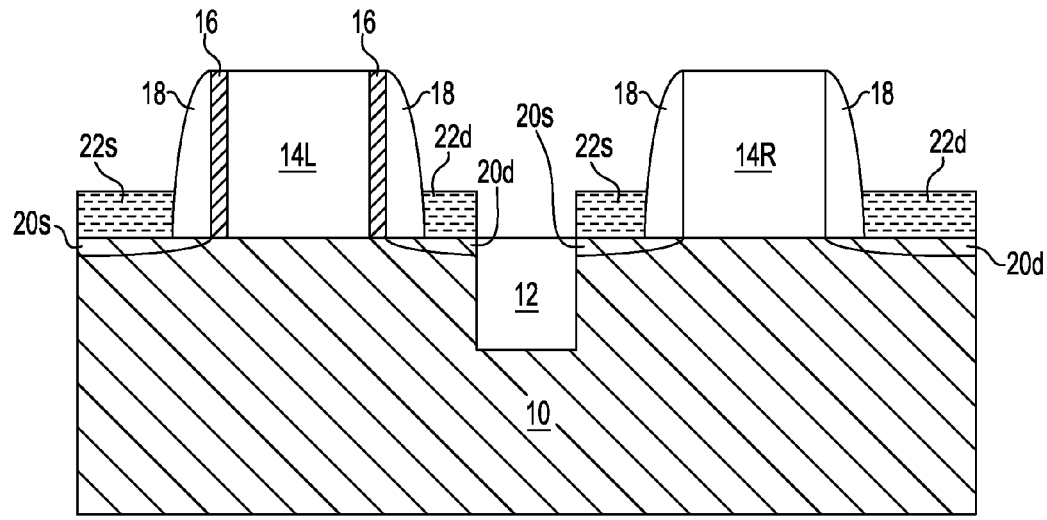
FIG. 5 is a cross sectional view of the first exemplary structure of FIG. 4 after forming a source region on one side of each sacrificial gate structure and a drain region on another side of each sacrificial gate structure.

In some embodiments of the present application, each sacrificial spacer 16 may be a native oxide material (or other material that can be selectively etched with respect to the spacer material 18 in FIG. 5) that is formed on each sacrificial gate structure 14L, 14R by simply exposing the structure shown in FIG. 1 to air. In other embodiments of the present application, each sacrificial spacer 16 can be formed on the sidewall surfaces of each sacrificial gate structure 14L, 14R utilizing a deposition process such as, for example, chemical vapor deposition, plasma enhanced chemical vapor deposition, physical vapor deposition, or atomic layer deposition. Following the deposition of a dielectric spacer material, an anisotropic etch may be used to form each sacrificial spacer 16. In yet another embodiment of the present application, each sacrificial spacer 16 may be formed by a thermal process such as, for example, thermal oxidation and/or thermal nitridation. In another embodiment, any combination of the above techniques may be used.

Each sacrificial spacer 16 that is formed has an upper surface that is coplanar with an upper surface of each sacrificial gate structure 14L, 14R. In this embodiment, each sacrificial spacer 16 that is formed also has a bottom surface that is direct physical contact with an upper semiconductor surface of the semiconductor substrate 10. Each sacrificial spacer 16 that is formed also has one sidewall surface that is direct physical contact with a sidewall surface of a sacrificial gate structure 14L, 14R, and another sidewall surface that is opposite the sidewall surface that is in direct physical contact with the sidewall surface of the sacrificial gate structure, that is bare. Each sacrificial spacer 16 that is formed is in the shape of an "I".

Figure 3:
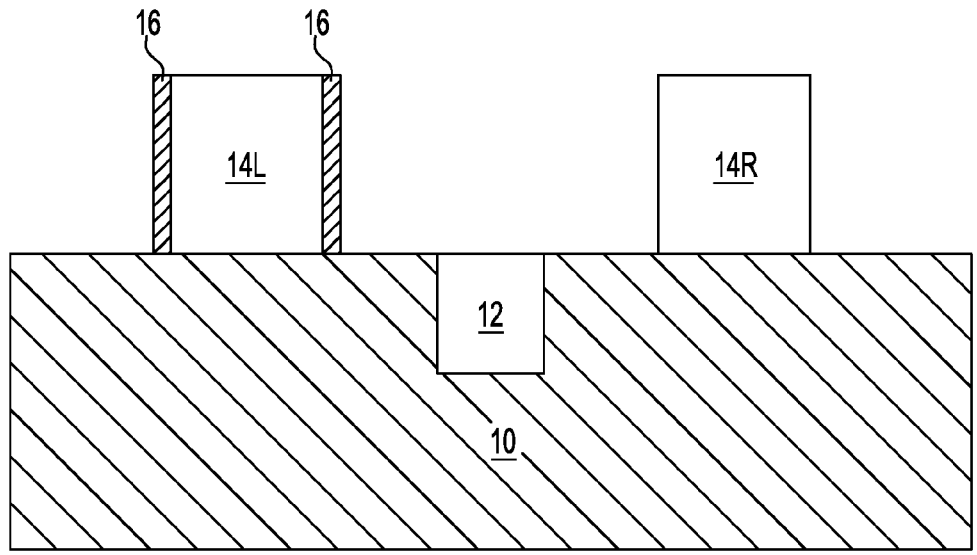
FIG. 3 is a cross sectional view of the first exemplary semiconductor structure of FIG. 2 after removing the sacrificial spacer from a second set of sacrificial gate structures of the plurality of sacrificial gate structures, while maintaining the sacrificial spacer on a first set of sacrificial gate structures of the plurality of sacrificial gate structures.

Referring now to FIG. 3, there is illustrated the first exemplary semiconductor structure of FIG. 2 after removing the sacrificial spacer 16 from a second set of sacrificial gate structures 14R of the plurality of sacrificial gate structures, while maintaining the sacrificial spacer 16 on a first set of sacrificial gate structures 14L of the plurality of sacrificial gate structures.

The removal of sacrificial spacer 16 from the second set of sacrificial gate structures 14R of the plurality of sacrificial gate structures, while maintaining the sacrificial spacer 16 on the first second set of sacrificial gate structures 14L of the plurality of sacrificial gate structures can be achieved by first forming a blanket layer of a masking material on the entire structure shown in FIG. 2. The masking material can be a photoresist material and/or a dielectric material that is different in composition from that of the sacrificial spacers 16. The masking material can be formed by a deposition process including, for example, chemical vapor deposition, plasma enhanced chemical vapor deposition, chemical solution deposition, evaporation or spin-on coating. The blanket layer of masking material is then patterned to provide a patterned mask over some areas of the structure, while leaving other areas of the structure exposed for further processing. The patterning can be achieved by lithography and etching. After forming the patterned mask, the sacrificial spacer 16 can be removed from the sacrificial gate structures 14R that do not include the patterned mask thereon by utilizing an etching process that selectively removes the sacrificial spacer 16 from the exposed sacrificial gate structures 14R. The etch used to remove the sacrificial spacer 16 from the sacrificial gate structures 14R not including the patterned mask may include an isotropic etch. In one example, a dilute HF solution can be used to remove the sacrificial spacer 16 from the sacrificial gate structures 14R not including the patterned mask. After removing the sacrificial spacers 16 gate structures 14R not including the patterned mask, the patterned mask is removed from atop gate structures 14L that still include the sacrificial spacers 16 thereon. The patterned mask can be removed utilizing an etching process.

It is noted that in some embodiments of the present application, the structure shown in FIG. 3 can be formed by forming a patterned mask on selected areas of the structure shown in FIG. 1, while leaving other selected areas of the structure exposed for further processing. Sacrificial spacers can then be formed on sidewall surfaces of the sacrificial gate structures that do not include the patterned mask. Next, the patterned mask can be removed resulting in the structure shown in FIG. 3.

Figure 4:
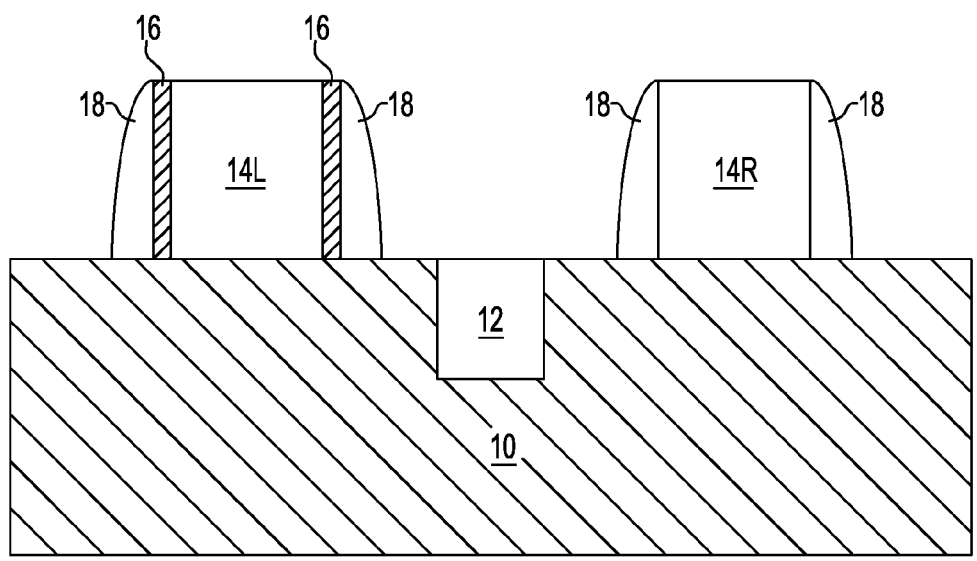
FIG. 4 is a cross sectional view of the first exemplary structure of FIG. 3 after providing a dielectric spacer to the first set of sacrificial gate structures and to the second set of sacrificial gate structures.

Referring now to FIG. 4, there is illustrated the first exemplary structure of FIG. 3 after providing a dielectric spacer 18 to the first set of sacrificial gate structures 14L and to the second set of sacrificial gate structures 14R. In the case of the second set of sacrificial gate structures 14R, the dielectric spacers 18 are formed in direct physical contact with a sidewall surface of the sacrificial gate structure 14R. In the case of the first set of sacrificial gate structures 14L in which the sacrificial spacers 16 were not removed, the dielectric spacers 18 are formed in direct physical contact with a sidewall surface of sacrificial spacer 16.

Each dielectric spacer 18 can be formed by first providing a spacer material and then etching the spacer material. The spacer material may be composed of any dielectric spacer material including, for example, a dielectric oxide, dielectric nitride, and/or dielectric oxynitride, which is different in composition from that of the sacrificial spacer 16. In one example, the spacer material used in providing each dielectric spacer 18 may be composed of silicon dioxide or silicon nitride. The spacer material used in providing each dielectric spacer 18 can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch. Each dielectric spacer 18 that is formed has a width, as measured from its base that is greater than a width of the sacrificial spacers 16.

In some embodiments of the present application, and prior to forming the dielectric spacers 18, a source extension region (not specifically shown) and a drain extension region (also not specifically shown) can be formed into the semiconductor substrate 10 by ion implantation. In areas of the structure including the sacrificial gate structures 14L and the sacrificial spacers 16, those two components can be used as an ion implantation mask, while in other areas of the structure, only the sacrificial gate structure 14R is used as an ion implantation mask. An activation anneal performed at a temperature of greater than 800° C. may follow the ion implantation process.

Referring now to FIG. 5, there is illustrated the first exemplary structure of FIG. 4 after forming a source region 20s on one side of each sacrificial gate structure 14L, 14R and a drain region 20d on another side of each sacrificial gate structure 14L, 14R. In some embodiments, the source region 20s and the drain region 20s can be formed within a semiconductor material portion of a substrate. In some embodiments, and as shown in FIG. 5, a raised source region 22s can be formed on a surface of the source region 20s, and a raised drain region 22d can be formed on a surface of the drain region 20d.

The source region 20s and the drain region 20d can be formed into the semiconductor substrate 10 and on opposite sides of the sacrificial gate structure 14L, 14R following the formation of the dielectric spacers 18. In some embodiments of the present application, the source region 20s and the drain region 20d can be formed by ion implantation. In areas of the structure including the sacrificial gate structures 14L and the sacrificial spacers 16, those two components can be used as an ion implantation mask, while in other areas of the structure, only the sacrificial gate structure 14R can be used as an ion implantation mask. An activation anneal performed at a temperature of greater than 800° C. may follow the ion implantation process.

In other embodiments of the present application, the source region 20s and the drain region 20d can be formed by first forming a trench within the semiconductor substrate 10. In areas of the structure including the sacrificial gate structures 14L and the sacrificial spacers 16, those two components can be used as an etch mask, while in other areas of the structure, only the sacrificial gate structure 14R can be used as etch mask. The trench is then filled with a doped semiconductor material utilizing an in-situ doped epitaxial growth process. In such an embodiment, and in one example, the doped semiconductor material may comprise a same semiconductor material as semiconductor substrate 10. In such an embodiment, and in one another example, the doped semiconductor material may comprise a different semiconductor material as semiconductor substrate 10. In some embodiments, a non-doped semiconductor material can be formed into each trench utilizing an epitaxial growth process, and thereafter a dopant can be introduced into the grown non-doped epitaxial semiconductor material by ion implantation or gas phase doping.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that can be employed include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the doped semiconductor material typically ranges from 550° C. to 900° C. Although higher temperature typically results in faster deposition, the faster deposition may result in crystal defects and film cracking.

A number of different sources may be used for the deposition of the doped semiconductor material. In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used. In addition to the above mentioned gases, the deposition of the doped semiconductor material also includes a dopant source gas. The dopant source gas may include an n-type dopant or a p-type dopant.

After forming the source region 20s and the drain region 20d, and in some embodiments, a raised source region 22s can be formed on a surface of the source region 20s and a raised drain region 22d can be formed on a surface of the drain region. In some embodiments of the present application, the raised source region 22s and raised drain region 22d includes a same semiconductor material as the corresponding underlying source region 20s and drain region 20d. In other embodiments of the present application, the raised source region 22s and raised drain region 22d includes a different semiconductor material as the corresponding underlying source region 20s and drain region 20d.

The raised source region 22s and raised drain region 22d may be formed utilizing an epitaxial growth process. In some embodiments, dopants can be introduced into a non-doped epitaxial grown material by ion implantation or gas phase doping. In another embodiment, an in-situ epitaxial growth process can be used in forming the raised source region 20 s and raised drain region 22d.

Figure 6:
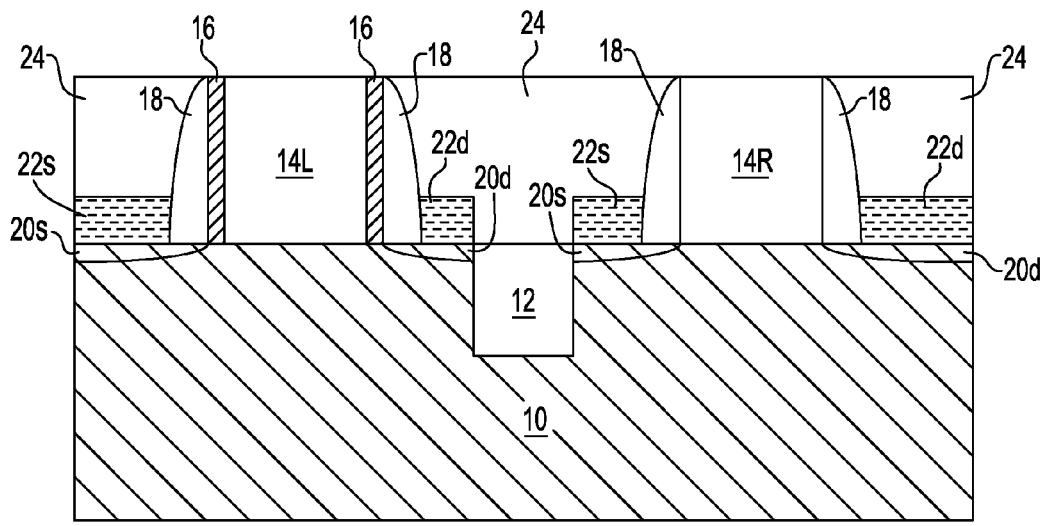
FIG. 6 is a cross sectional view of the first exemplary semiconductor structure of FIG. 5 after providing a dielectric material having an upper surface that coplanar with an upper surface of each sacrificial gate structure.

Referring now to FIG. 6, there is illustrated the first exemplary semiconductor structure of FIG. 5 after providing a dielectric material 24 having an upper surface that coplanar with an upper surface of each sacrificial gate structure 14L, 14R. As such, the upper surface of the each sacrificial gate structure 14L, 14R is exposed after forming the dielectric material 24.

In some embodiments, the dielectric material 24 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 24. The use of a self-planarizing dielectric material as dielectric material 24 may avoid the need to perform a subsequent planarizing step.

In one embodiment, the dielectric material 24 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 24, a planarization process or an etch back process follows the deposition of the dielectric material. The thickness of the dielectric material 24 that can be employed in the present application may vary depending on the type of dielectric material employed as well as the method that was employed in forming the same. In one embodiment, the dielectric material 24 has a thickness from 80 nm to 500 nm. Other thicknesses that are greater or lesser than the range provided above can also be used for the dielectric material 24.

Figure 7:
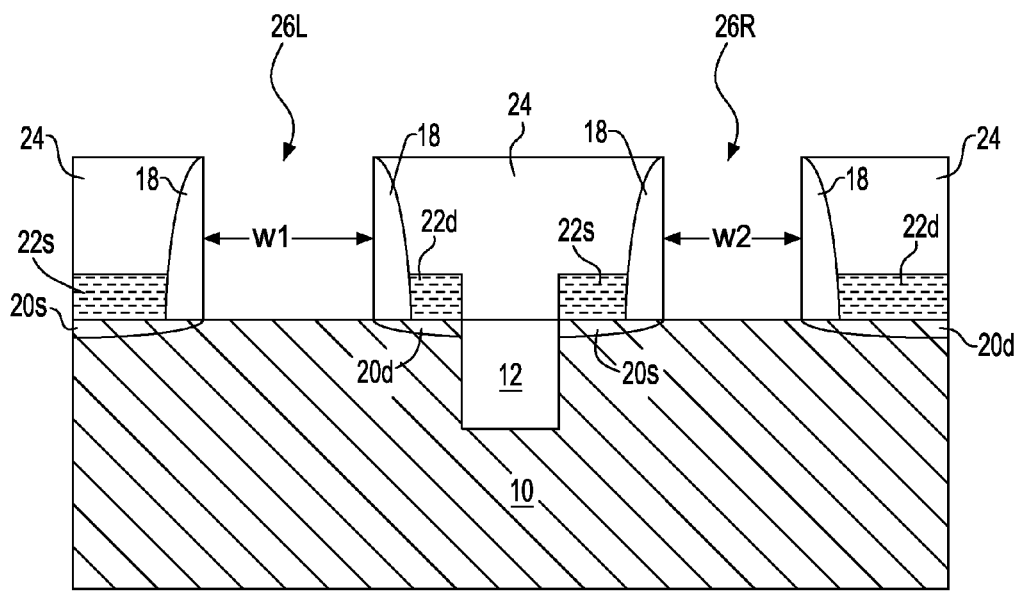
FIG. 7 is a cross sectional view of the first exemplary semiconductor structure of FIG. 6 after removing each sacrificial gate structure of the first set of sacrificial gate structures and the sacrificial spacer providing first gate cavities having a first width and removing each sacrificial gate structure of the second set of sacrificial gate structures providing second gate cavities having a second width, wherein the second width is lesser than the first width.

Referring now to FIG. 7, there is illustrated the first exemplary semiconductor structure of FIG. 6 after removing each sacrificial gate structure 14L of the first set of sacrificial gate structures and sacrificial spacers 16 providing first gate cavities 26L having a first width, w1, and removing each sacrificial gate structure 14R of the second set of sacrificial gate structures providing second gate cavities 26R having a second width, w2, wherein the second width is lesser than the first width. It is noted that the first width, w1, of the first gate cavity 26L defines a first gate length, while the second width, w2, of the second gate cavity 26R defines a second gate length.

Each sacrificial gate structure 14L, 14R can be removed by etching. In one example, a reactive ion etch can be used to removal each sacrificial gate material structure 14L, 14R. The sacrificial spacers 16 can be removed utilizing another etching process. In one example, the sacrificial spacers 16 can be removed utilizing an anisotropic etching process.

Figure 8:
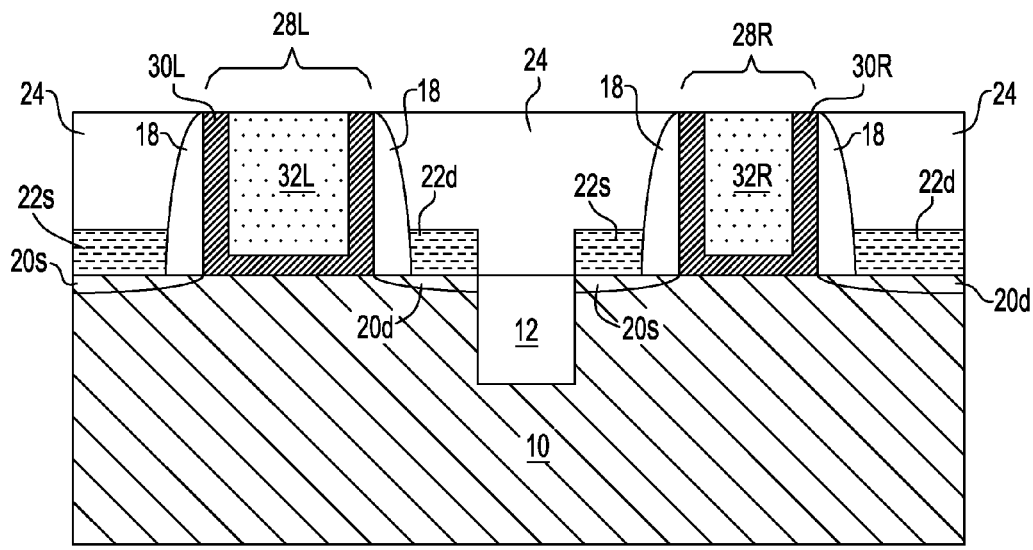
FIG. 8 is a cross sectional view of the first exemplary semiconductor structure of FIG. 7 after forming a functional gate structure in each of the first and second gate cavities.

Referring now to FIG. 8, there is illustrated the first exemplary semiconductor structure of FIG. 7 after forming a functional gate structure 28L, 28R in each gate cavity 26L, 26R. In accordance with the present application, the functional gate structure 28L formed within the first gate cavity 26L has a gate length that is greater than the gate length of the functional gate structure 28R formed within the second gate cavity 26R. The term "functional gate structure" is used throughout the present application as a permanent gate structure (used to control output current (i.e., flow of carriers in the channel) of a semiconducting device through electrical or magnetic fields.

Each functional gate structure 28L, 28R includes at least a gate dielectric portion 30L, 30R and a gate conductor portion 32L, 32R. In some embodiments and as shown in the drawing, each gate dielectric portion 30L, 30R is U-shaped having a bottommost portion in direct contact with an upper surface of the semiconductor substrate 10 and vertical portions that are located on exposed sidewalls of each dielectric spacer 20. Within each gate cavity 26L, 26R, the gate dielectric portion 30L, 30R surrounds the gate conductor portion 32L, 32R. In another embodiment (not shown), the gate dielectric portion 30R, 30R is not U-shaped and thus lacks the vertical portions mentioned. In such an embodiment, the gate conductor portion 32L, 32R that is formed atop the non-U-shaped gate dielectric fills the remaining portion of each gate cavity 26L, 26R and has outermost edges that directly contact a sidewall surface of each dielectric spacer 18. In some embodiments, some of the gate dielectric portions can be U-shaped, while other gate dielectric portions can be non U-shaped.

The gate dielectric material that provides the gate dielectric material portion 30L, 30R of the functional gate structure can be an oxide, nitride, and/or oxynitride. In one example, the gate dielectric material that provides the gate dielectric material portion 30L, 30R of the functional gate structure 28L, 28R can be a high k material having a dielectric constant greater than silicon dioxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high k gate dielectric can be formed.

Each gate dielectric portion 30L, 30R comprises a gate dielectric material. In some embodiments, the gate dielectric material that provides gate dielectric portion 30L is of a same composition as that of the gate dielectric material that provides gate dielectric portion 30R. In other embodiments, the gate dielectric material that provides gate dielectric portion 30L is of a different composition as that of the gate dielectric material that provides gate dielectric portion 30R. When different gate dielectric materials are used, block mask technology can be used to form the different gate dielectric materials within the first and second gate cavities 26L, 26R.

The gate dielectric material that provides the gate dielectric material portion 30L, 30R can be an oxide, nitride, and/or oxynitride. In one example, the gate dielectric material that provides the gate dielectric material portion 30L, 30R can be a high k material having a dielectric constant greater than silicon dioxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high k gate dielectric can be formed.

The gate dielectric material used in providing the gate dielectric material portion 30L, 30R can be formed by any deposition technique including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric material portion 30L 30R can have a thickness in a range from 1 nm to 10 nm. Other thicknesses that are lesser than or greater than the aforementioned thickness range can also be employed for the gate dielectric material.

Each gate conductor portion 32L, 32R comprises a gate conductor material. In some embodiments, the gate conductor material that provides gate conductor portion 32L is of a same composition as that of the gate conductor material that provides gate conductor portion 32R. In other embodiments, the gate conductor material that provides gate conductor portion 32L is of a different composition as that of the gate conductor material that provides gate conductor portion 32R. When different gate conductor materials are used, block mask technology can be used to form the different gate conductor materials within the first and second gate cavities 26L, 26R.

The gate conductor material used in providing the gate conductor material portion 32L, 32R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate conductor material used in providing the gate conductor material portion 32L, 32R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor material portion 32L, 32R of the functional gate structure has a thickness from 1 nm to 100 nm. Other thicknesses that are lesser than or greater than the aforementioned thickness range can also be employed for the gate conductor material.

Reference is first made to FIGS. 9-16 which illustrate an embodiment of the present application in which a non-planar semiconductor device having functional gate structures of different critical dimensions, i.e., gate lengths, is formed utilizing a replacement gate process.

Figure 9:
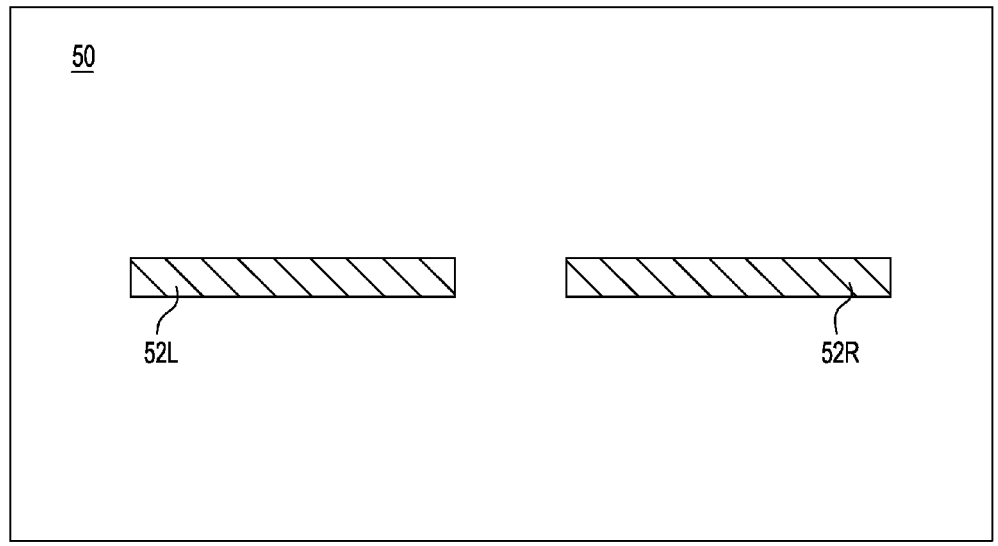
FIG. 9 is a top-down view of a second exemplary semiconductor structure including at least one semiconductor fin extending from a surface of a substrate.

Referring first to FIG. 9, there is illustrated a second exemplary semiconductor structure including at least one semiconductor fin extending from a surface of a substrate 50. In the drawing, two semiconductor fins 52L, 52R which are horizontally aligned to each other are shown by way of an example.

In one embodiment of the present application, substrate 50 is an insulator layer, e.g., silicon dioxide, which can be positioned on a surface of a handle substrate (not shown). The insulator layer and handle substrate are components of a SOI substrate. In such an embodiment, each semiconductor fin 52L, 52R is from within a top semiconductor layer of the SOI substrate and thus has an interface with the insulating substrate. In another embodiment, the substrate 50 is a semiconductor material including one of the semiconductor materials mentioned above for semiconductor substrate 10. In this embodiment, each semiconductor fin 52L, 52R lacks an interface with substrate 50.

Each semiconductor fin 52L, 52R can be comprised of one of the semiconductor materials that were mentioned above for semiconductor substrate 10. In one embodiment of the present application, each semiconductor fin 52L, 52R may be comprised of silicon.

The second exemplary semiconductor structure shown in FIG. 9 can be formed by lithography and etching. Lithography can include forming a photoresist (not shown) on a topmost surface of a semiconductor material, exposing the photoresist to a desired pattern of radiation, and then developing the exposed photoresist with a conventional resist developer to provide a patterned photoresist atop the semiconductor material. At least one etch is then employed which transfers the pattern from the patterned photoresist into the semiconductor material. In one embodiment, the etch used for pattern transfer may include a dry etch process such as, for example, reactive ion etching, plasma etching, ion beam etching or laser ablation. In another embodiment, the etch used for pattern transfer may include a sidewall image transfer (SIT) process. After transferring the pattern into the semiconductor material, the patterned photoresist can be removed utilizing a conventional resist stripping process such as, for example, ashing.

As used herein, a "semiconductor fin" refers to a contiguous structure including a semiconductor material and including a pair of vertical sidewalls that are parallel to each other. As used herein, a surface is "vertical" if there exists a vertical plane from which the surface does not device by more than three times the root mean square roughness of the surface.

In one embodiment of the present application, each semiconductor fin 52L, 52R has a height from 10 nm to 100 nm, and a width from 4 nm to 30 nm. In another embodiment of the present application, each semiconductor fin 52L, 52R has a height from 15 nm to 50 nm, and a width from 5 nm to 12 nm.

Figure 10:
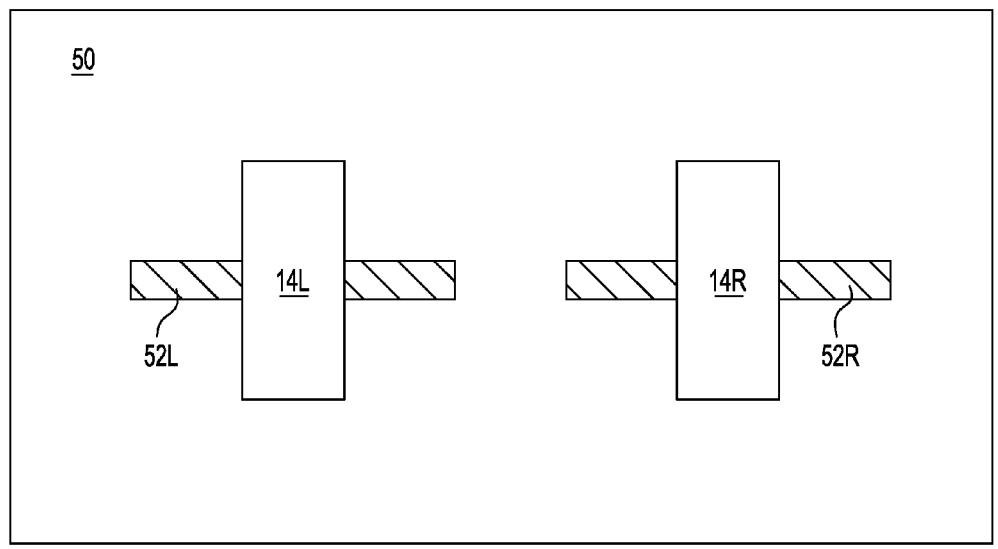
FIG. 10 is a top-down view of the second exemplary semiconductor structure of FIG. 9 after forming a plurality of sacrificial gate structures which straddle the at least one semiconductor fin and are orientated perpendicular to the at least one semiconductor fin.

Referring now to FIG. 10, there is illustrated the second exemplary semiconductor structure of FIG. 9 after forming a plurality of sacrificial gate structures 14L, 14R which straddle the at least one semiconductor fin 52L, 52R and are orientated perpendicular to the at least one semiconductor fin 52L, 52R. In this embodiment of the present application, each sacrificial gate structures 14L, 14R has a bottom surface that contacts an upper surface of substrate 50, as well as vertical sidewalls and an upper surface of a semiconductor fin 52L, 52R. The sacrificial gate structures 14L, 14R of this embodiment of the present application can be formed and include the same materials as described in the previous embodiment of the present application.

Figure 11:
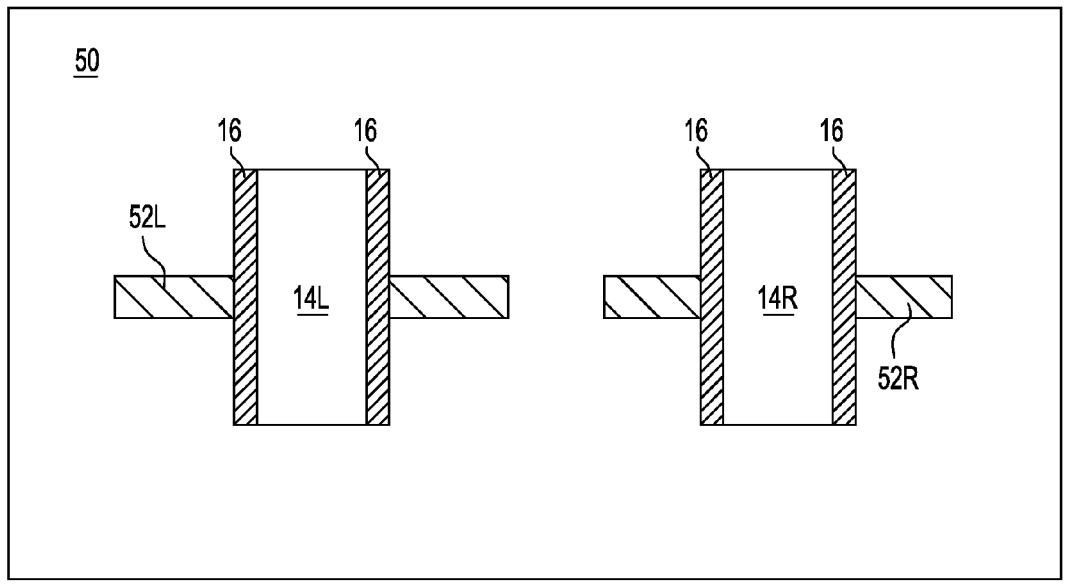
FIG. 11 is a top-down view of the second exemplary semiconductor structure of FIG. 10 after forming a sacrificial spacer on vertical sidewalls of each sacrificial gate structure and straddling the at least one semiconductor fin.

Referring now to FIG. 11, there is illustrated the second exemplary semiconductor structure of FIG. 10 after forming a sacrificial spacer 16 on vertical sidewalls of each sacrificial gate structure 14L, 14R and straddling the at least one semiconductor fin 52L, 52R. In this embodiment of the present application, each sacrificial spacer 16 has a bottom surface that contacts an upper surface of substrate 50, vertical sidewalls of a sacrificial gate structure 14L, 14R, an upper of a sacrificial gate structure 14L, 14R and an upper surface of a semiconductor fin 52L, 52R. The sacrificial spacers 16 of this embodiment of the present application can be formed and include the same materials as described in the previous embodiment of the present application.

Figure 12:
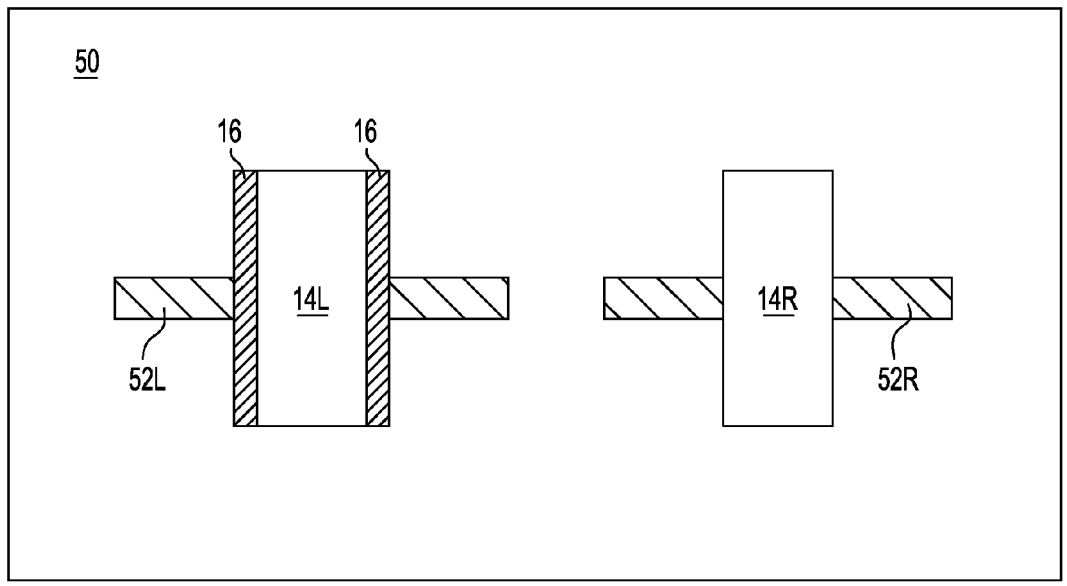
FIG. 12 is a top-down view of the second exemplary semiconductor structure of FIG. 11 after removing the sacrificial spacer from a second set of sacrificial gate structures of the plurality of sacrificial gate structures, while maintaining the sacrificial spacer on a first set of sacrificial gate structures of the plurality of sacrificial gate structures.

Referring now to FIG. 12, there is illustrated the second exemplary semiconductor structure of FIG. 11 after removing the sacrificial spacer 16 from a second set of sacrificial gate structures 14R of the plurality of sacrificial gate structures, while maintaining the sacrificial spacer 16 on a first set of sacrificial gate structures 14L of the plurality of sacrificial gate structures. The removal of the sacrificial spacer from the structure can be provided as described above in removing the sacrificial spacer from some of the sacrificial gate structures in the previous embodiment of the present application. It is also noted the masking technique mentioned above can be used in lieu of providing the sacrificial spacers 16 to all of the sacrificial gate structures 14L, 14R.

Figure 13:
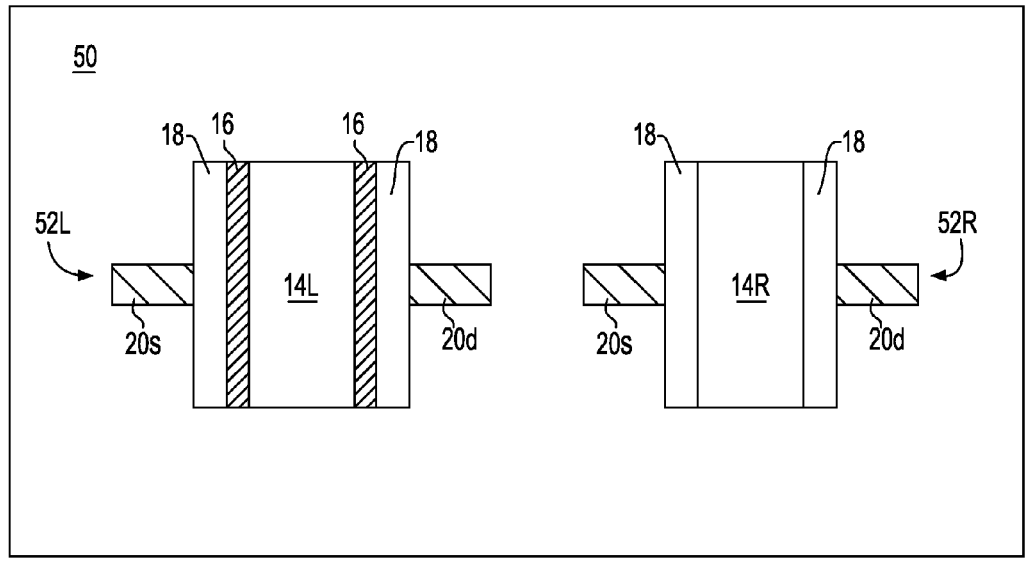
FIG. 13 is a top-down view of the second exemplary semiconductor structure of FIG. 12 after providing a dielectric spacer to the first set of sacrificial gate structures and to the second set of sacrificial gate structures.

Referring now to FIG. 13, there is illustrated the second exemplary semiconductor structure of FIG. 12 after providing a dielectric spacer 18 to the first set of sacrificial gate structures 14L and to the second set of sacrificial gate structures 14R. In the case of the second set of sacrificial gate structures 14R, the dielectric spacers 18 are formed in direct physical contact with a sidewall surface of the sacrificial gate structure. In the case of the first set of sacrificial gate structures 14L in which the sacrificial spacers 16 were not removed, the dielectric spacers 18 are formed in direct physical contact with a sidewall surface of sacrificial spacer 16. The dielectric spacers 18 are formed in direct physical contact with a sidewall surface of sacrificial spacer 16. Dielectric spacers 18 can be formed and include the same materials as described in the previous embodiment of the present application.

In some embodiments of the present application, and as also shown in FIG. 13, a source region 20s and a drain region 20d can be formed into exposed semiconductor portions of each semiconductor fin 52L, 52R at this point of the present application by ion implantation or gas phase doping. Raised source regions and raised drain regions (not shown) can also be formed at this point of the present application. The formation of the raised source region and raised drain region is not shown in drawings for this embodiment of the present application. Also, merging of end portions of laterally oriented semiconductor fins can now be performed by selective epitaxial growth. The merging of laterally oriented semiconductor fins is not shown in the drawings of the present application.

Figure 14:
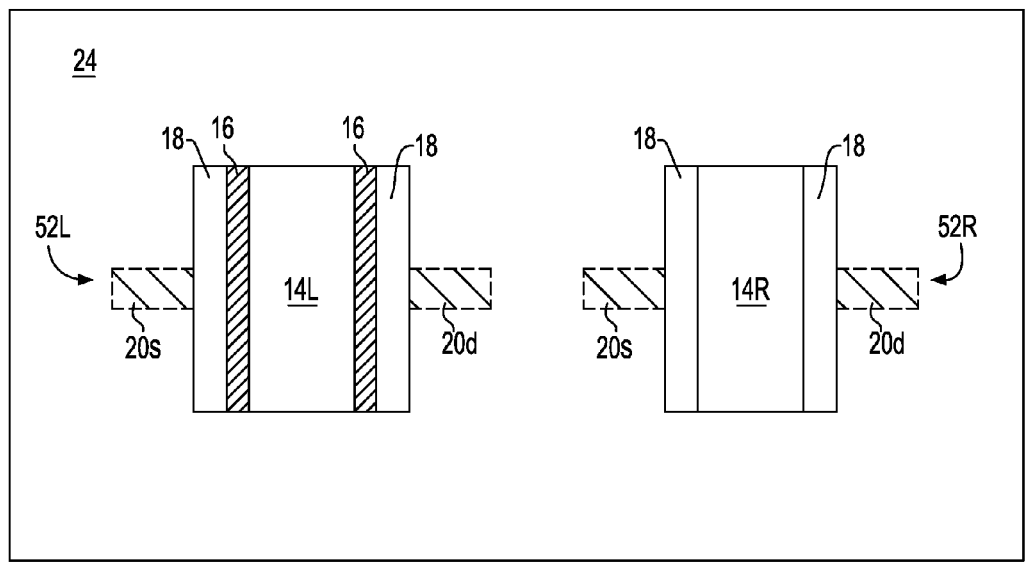
FIG. 14 is a top down-view of the secondary exemplary semiconductor structure of FIG. 13 after providing a dielectric material having an upper surface that coplanar with an upper surface of each sacrificial gate structure.

Referring now to FIG. 14, there is illustrated the secondary exemplary semiconductor structure of FIG. 13 after providing a dielectric material 24 having an upper surface that coplanar with an upper surface of each sacrificial gate structure 14L, 14R. In this embodiment, the dielectric material has a bottommost surface in contact with an upper surface of substrate 50 as well as vertical sidewalls and an upper surface of each semiconductor fin 52L, 52R which do not include either the sacrificial spacer 16 or the sacrificial gate structures 14L, 14R. Dielectric material 24 can be formed and include the same materials as described in the previous embodiment of the present application. Since the dielectric material 24 would be located above the semiconductor fins 52L, 52R and thus cover the fins, the semiconductor fins 52L, 52R are shown as dotted lines in the drawings of the present application.

Figure 15:
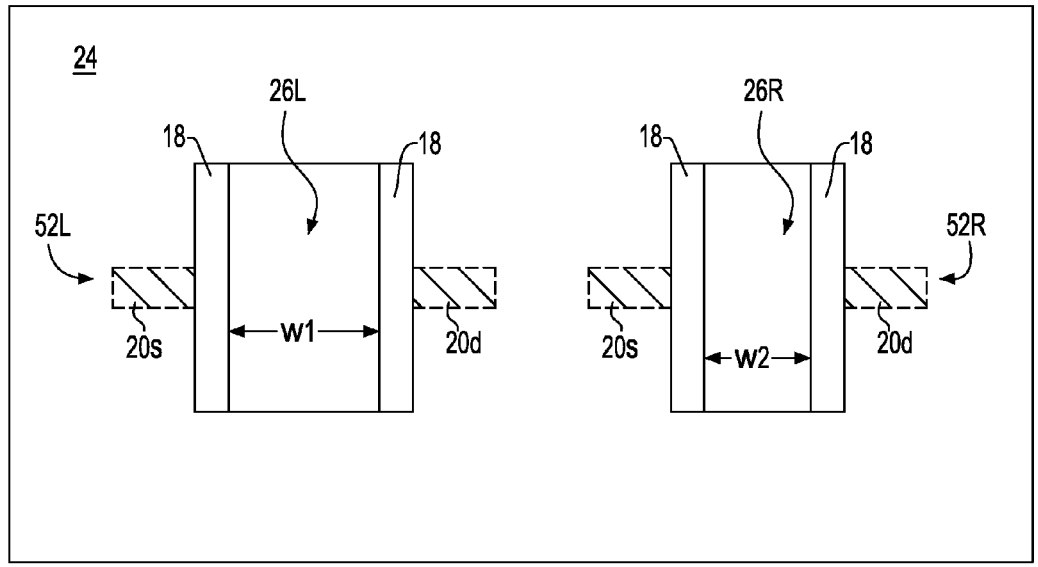
FIG. 15 is a top-down view of the second exemplary semiconductor structure of FIG. 14 after removing each sacrificial gate structure of the first set of sacrificial gate structures and the sacrificial spacer providing first gate cavities having a first width and removing each sacrificial gate structure of the second set of sacrificial gate structures providing second gate cavities having a second width, wherein the second width is lesser than the first width.

Referring now to FIG. 15, there is illustrated the second exemplary semiconductor structure of FIG. 14 after removing each sacrificial gate structure 14L of the first set of sacrificial gate structures and sacrificial spacers 16 providing first gate cavities 26L having a first width, w1, and removing each sacrificial gate structure 14R of the second set of sacrificial gate structures providing second gate cavities 26R having a second width, wherein the second width is lesser than the first width. The removal of the each sacrificial gate structure 14R, 14L and sacrificial spacers 16 for this embodiment of the present application is the same as that described above in the previous embodiment of the present application.

Figure 16:
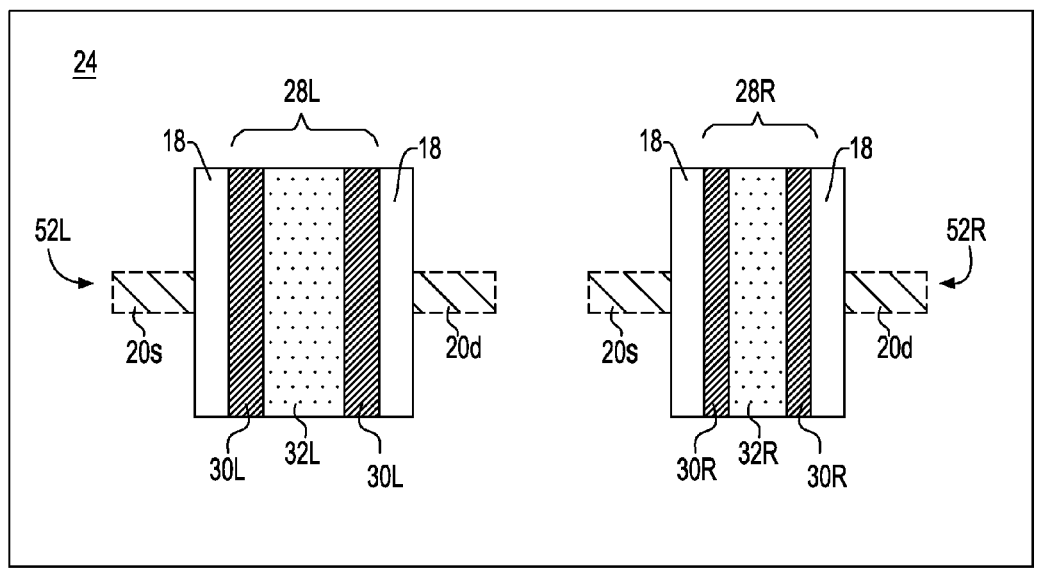
FIG. 16 is a top-down view of the second exemplary semiconductor structure of FIG. 15 after forming a functional gate structure in each of the first and second gate cavities and straddling the at least one semiconductor fin.

Referring now to FIG. 16, there is illustrated the second exemplary semiconductor structure of FIG. 15 after forming a functional gate structure 28L, 28L in each gate cavity (i.e., 26L, 26R) and straddling the at least one semiconductor fin 52L. Each functional gate structure 28L, 28R includes a gate dielectric portion 30L, 30R and a gate conductor portion 32L, 32R. The functional gate structures 28L, 28R including the gate dielectric portion 30L, 30R and the gate conductor portion 32L, 32R can be formed and include the same materials as described in the previous embodiment of the present application.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming of a semiconductor device having functional gate structures with different critical dimensions, said method comprising:

forming providing a plurality of sacrificial gate structures on a surface of a substrate, wherein a first set of said plurality of sacrificial gate structures contains a sacrificial spacer located on a sidewall surfaces of each sacrificial gate structure, and a second set of said plurality of sacrificial gate structures contains sacrificial gate structures having bare sidewall surfaces;

providing a dielectric spacer to said first and second sets of said plurality of sacrificial gate structures, wherein each dielectric spacer provided to said first set of said plurality of sacrificial gate structures contacts a sidewall surface of said sacrificial spacer and each dielectric spacer provided to said second set of said plurality of sacrificial gate structures contacts said bare sidewall surfaces of the sacrificial gate structures;

removing each sacrificial gate structure of said first set of said plurality of sacrificial gate structures and said sacrificial spacers to provide first cavities having a first width, and each sacrificial gate structure of said second set of said plurality of sacrificial gate structures to provide second cavities having a second width, wherein said second width is lesser than the first width; and forming a functional gate structure in each of said first and second gate cavities.

2. The method of claim 1, wherein said forming said plurality of sacrificial gate structures on said surface of said substrate, comprising:

depositing a layer of sacrificial gate structure material; and patterning the layer of sacrificial gate structure material by lithography and etching or a sidewall image transfer process.

3. The method of claim 2, further comprising:

providing said sacrificial spacer to each of said sacrificial gate structures of said first and said second sets of said plurality of sacrificial gate structures; and selectively removing the sacrificial spacer from said second set of sacrificial gate structures.

4. The method of claim 2, further comprising:

forming a patterned mask on areas of said substrate including said second set of said plurality of sacrificial gate structures;

providing said sacrificial spacer to said first set of said plurality of sacrificial gate structures; and removing said patterned mask for said areas of said substrate including said second set of said plurality of sacrificial gate structures.

5. The method of claim 1, wherein said substrate comprises a semiconductor material having a planar upper surface.

6. The method of claim 1, wherein said substrate comprises a plurality of semiconductor fins, wherein each sacrificial gate structure straddles at least one semiconductor fin of the plurality of semiconductor fins.

7. The method of claim 1, wherein said sacrificial spacer is formed by one of exposing said sacrificial gate structure to air, a thermal process, and deposition of a dielectric spacer material and etching, and wherein each sacrificial spacer comprises a single spacer material, more than one spacer material or any combination thereof.

8. The method of claim 1, wherein after said forming of said dielectric spacer and prior to said removing each sacrificial gate structure, a source region and a drain region are formed into a semiconductor material portion of said substrate that is located on opposite sides of each sacrificial gate structure of said first and second sets of said plurality of said sacrificial gate structures.

9. The method of claim 8, wherein said semiconductor portion of said substrate comprises an exposed end portion of a semiconductor fin.

10. The method of claim 8, further comprising forming a raised source region on a surface of said source region, and forming a raised drain region on a surface of said drain region.

11. The method of claim 1, wherein after said forming of said dielectric spacer and prior to said removing each sacrificial gate structure a dielectric material is provided that has an upper surface that is coplanar to an upper surface of each sacrificial gate structure of said first and second sets of said plurality of sacrificial gate structures.

12. The method of claim 1, wherein said removing each sacrificial gate structure of said first set and said second set of said plurality of sacrificial gate structures comprises reactive ion etching, and said removing the sacrificial spacers comprises an anisotropic etch.

13. The method of claim 1, wherein each of said functional gate structures includes a gate dielectric portion and a gate conductor portion.

14. The method of claim 13, wherein said gate dielectric portion is U-shaped, and said gate conductor portion is contained within said U-shaped gate dielectric portion.

15. The method of claim 13, wherein said gate dielectric portion is non U-shaped, and the gate conductor portion has surfaces contacting said dielectric spacer.

16. A method of forming of a semiconductor device having functional gate structures with different critical dimensions, said method comprising:

forming a plurality of semiconductor fins extending from a surface of a substrate;

providing a plurality of sacrificial gate structures, wherein each sacrificial gate structure of said plurality of sacrificial gate structures is oriented perpendicular to and straddling at least one semiconductor fin of said plurality of said semiconductor fins, and wherein a first set of said plurality of sacrificial gate structures contains a sacrificial spacer located on a sidewall surfaces of each sacrificial gate structure, and a second set of said plurality of sacrificial gate structures contains sacrificial gate structures having bare sidewall surfaces;

providing a dielectric spacer to said first and second sets of said plurality of sacrificial gate structures, wherein each dielectric spacer provided to said first set of said plurality of sacrificial gate structures contacts a sidewall surface of said sacrificial spacer and each dielectric spacer provided to said second set of said plurality of sacrificial gate structures contacts said bare sidewall surfaces of the sacrificial gate structures;

removing each sacrificial gate structure of said first set of said plurality of sacrificial gate structures and said sacrificial spacers to provide first cavities having a first width, and each sacrificial gate structure of said second set of said plurality of sacrificial gate structures to provide second cavities having a second width, wherein said second width is lesser than the first width; and forming a functional gate structure in each of said first and second gate cavities.

17. The method of claim 16, wherein said substrate comprising an insulator layer, and wherein an interface is present between an upper surface of said insulator layer and a bottom surface of each semiconductor fin.

18. The method of claim 16, wherein said substrate comprising a semiconductor material, and wherein no interface is present between an upper surface of said semiconductor material and a bottom surface of each semiconductor fin.

19. The method of claim 16, wherein each of said functional gate structures includes a gate dielectric portion and a gate conductor portion, and wherein said gate dielectric portion is U-shaped, and said gate conductor portion is contained within said U-shaped gate dielectric portion.

* * * * *